US011043599B2

(12) United States Patent
Nishimiya et al.

(10) Patent No.: US 11,043,599 B2
(45) Date of Patent: Jun. 22, 2021

(54) SEMICONDUCTOR DEVICE AND METHOD FOR PRODUCING SAME

(71) Applicant: Sharp Kabushiki Kaisha, Sakai (JP)

(72) Inventors: Setsuji Nishimiya, Sakai (JP); Tohru Daitoh, Sakai (JP); Masahiko Suzuki, Sakai (JP); Kengo Hara, Sakai (JP); Hajime Imai, Sakai (JP); Toshikatsu Itoh, Sakai (JP); Hideki Kitagawa, Sakai (JP); Tetsuo Kikuchi, Sakai (JP); Teruyuki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/493,803

(22) PCT Filed: Mar. 8, 2018

(86) PCT No.: PCT/JP2018/008971
§ 371 (c)(1),
(2) Date: Dec. 9, 2019

(87) PCT Pub. No.: WO2018/168369
PCT Pub. Date: Sep. 20, 2018

(65) Prior Publication Data
US 2021/0036158 A1  Feb. 4, 2021

(30) Foreign Application Priority Data

Mar. 14, 2017 (JP) .............................. JP2017-048925

(51) Int. Cl.
| H01L 21/00 | (2006.01) |
| H01L 29/786 | (2006.01) |
| H01L 21/02 | (2006.01) |
| H01L 21/467 | (2006.01) |

(Continued)

(52) U.S. Cl.
CPC .... *H01L 29/7869* (2013.01); *H01L 21/02565* (2013.01); *H01L 21/467* (2013.01);
(Continued)

(58) Field of Classification Search
CPC .......... H01L 29/7869; H01L 21/02565; H01L 21/467; H01L 21/477; H01L 29/24; H01L 29/66969
See application file for complete search history.

(56) References Cited

U.S. PATENT DOCUMENTS 8,115,201 B2 * 2/2012 Yamazaki ........... H01L 29/7869
257/43
8,703,531 B2 * 4/2014 Honda .............. H01L 21/02667
438/104

(Continued)

FOREIGN PATENT DOCUMENTS

| JP | 2010-021555 A | 1/2010 |
| JP | 2012-134475 A | 7/2012 |

(Continued)

*Primary Examiner* — Richard A Booth
(74) *Attorney, Agent, or Firm* — Keating & Bennett, LLP

(57) ABSTRACT

A semiconductor device (100) includes a TFT (10) supported on a substrate (11), wherein the TFT (10) includes a gate electrode (12g), a gate insulating layer (14) that covers the gate electrode (12g), and an oxide semiconductor layer (16) that is formed on the gate insulating layer (14). The oxide semiconductor layer 16 has a layered structure including a first oxide semiconductor layer (16a) in contact with the gate insulating layer (14) and a second oxide semiconductor layer (16b) layered on the first oxide semiconductor layer (16a). The first oxide semiconductor layer (16a) and the second oxide semiconductor layer (16b) both include In, Ga and Zn; an In atomic ratio of the first oxide semiconductor layer (16a) is greater than a Zn atomic ratio thereof, and an In atomic ratio of the second oxide semiconductor layer (16b) is smaller than a Zn atomic ratio thereof; and the (Continued)

oxide semiconductor layer (16) has a side surface of a forward tapered shape.

7 Claims, 5 Drawing Sheets

(51) Int. Cl.
    *H01L 21/477*     (2006.01)
    *H01L 29/24*     (2006.01)
    *H01L 29/66*     (2006.01)

(52) U.S. Cl.
    CPC ............ *H01L 21/477* (2013.01); *H01L 29/24* (2013.01); *H01L 29/66969* (2013.01)

(56) References Cited

U.S. PATENT DOCUMENTS

| | | | |
|---|---|---|---|
| 9,825,057 B2 * | 11/2017 | Yamazaki | .......... H01L 27/3262 |
| 2010/0006834 A1 | 1/2010 | Kim et al. | |
| 2010/0219410 A1 | 9/2010 | Godo et al. | |
| 2011/0121284 A1 | 5/2011 | Yamazaki et al. | |
| 2011/0127522 A1 | 6/2011 | Yamazaki | |
| 2012/0138922 A1 | 6/2012 | Yamazaki et al. | |
| 2013/0256653 A1 | 10/2013 | Ahn et al. | |
| 2013/0320334 A1 | 12/2013 | Yamazaki et al. | |
| 2014/0286076 A1 | 9/2014 | Aoki et al. | |
| 2015/0153599 A1 | 6/2015 | Yamazaki et al. | |

FOREIGN PATENT DOCUMENTS

| | | |
|---|---|---|
| JP | 2013-214701 A | 10/2013 |
| JP | 2014-007399 A | 1/2014 |
| JP | 2014-209727 A | 11/2014 |
| JP | 2015-062248 A | 4/2015 |
| JP | 2015-097275 A | 5/2015 |
| JP | 2015-130487 A | 7/2015 |
| JP | 2015-167242 A | 9/2015 |

* cited by examiner (a)

(b)

(a)

(b)

500nm

500nm (a)

(b)

SEMICONDUCTOR DEVICE AND METHOD FOR PRODUCING SAME

TECHNICAL FIELD

The present invention relates to a semiconductor device including a thin film transistor (hereinafter, a "TFT") using an oxide semiconductor, and a method for manufacturing the same. The semiconductor device includes liquid crystal display panels and organic EL display panels, and active matrix substrates for use in these display panels, for example.

BACKGROUND ART

An active matrix substrate used in a liquid crystal display panel, or the like, includes a thin film transistor (hereinafter, a "TFT") for each pixel. As a TFT provided for each pixel (hereinafter, referred to as a "pixel TFT"), a TFT using an amorphous silicon film as the active layer (hereinafter, referred to as an "amorphous silicon TFT") and a TFT using a polycrystalline silicon film as the active layer (hereinafter, referred to as a "polycrystalline silicon TFT") have been widely used. Recently, liquid crystal display panels using TFTs that use an oxide semiconductor film as the active layer (hereinafter, referred to as "oxide semiconductor TFTs") have been developed. An oxide semiconductor TFT is capable of operating at a higher speed than an amorphous silicon TFT, and characteristically has a low OFF current.

On the other hand, a technique for monolithically (integrally) providing driving circuits such as a gate driver and a source driver on an active matrix substrate has become commercially practical. Although polycrystalline silicon TFTs, which have a high mobility, have been used many cases as TFTs of driving circuits (hereinafter, referred to as "circuit TFTs"), consideration has recently been given to using oxide semiconductor TFTs.

As a method for improving the characteristics of an oxide semiconductor TFT, a technique for providing an oxide semiconductor layer that includes two layers (the upper layer and the lower layer) having different compositions from each other has been known in the art. For example, Patent Document No. 1 discloses a technique which an oxide semiconductor layer includes an upper layer and a lower layer having different mobilities from each other, and one of the upper layer and the lower layer that has a higher mobility is arranged closer to the gate electrode, thereby adjusting the mobility and the threshold voltage. According to Patent Document No. 1, the arrangement of the upper layer and the lower layer can be applied to either the bottom gate type or the top gate type.

CITATION LIST

Patent Literature

Patent Document No. 1: Japanese Laid-Open Patent Publication No. 2010-21555

SUMMARY OF INVENTION

Technical Problem

According to a study by the present inventors, when an oxide semiconductor layer includes two layers having different compositions from each other (the upper layer and the lower layer), the reliability may lower.

The present invention has been made to solve the problem described above, and an object thereof is to provide a semiconductor device including oxide semiconductor TFTs and a method for manufacturing the same, wherein the reliability can be improved.

Solution to Problem

A semiconductor device according to an embodiment of the present invention includes: a substrate and a TFT supported on the substrate, wherein: the TFT includes a gate electrode, a gate insulating layer that covers the gate electrode, and an oxide semiconductor layer that is formed on the gate insulating layer; the oxide semiconductor layer has a layered structure including a first oxide semiconductor layer in contact with the gate insulating layer and a second oxide semiconductor layer layered on the first oxide semiconductor layer, wherein the first oxide semiconductor layer and the second oxide semiconductor layer both include In, Ga and Zn, and an In atomic ratio with respect to all metal elements is greater than a Zn atomic ratio thereof, and an In atomic ratio with respect to all metal elements of the second oxide semiconductor layer is smaller than the Zn atomic ratio thereof; and the oxide semiconductor layer has a side surface of a forward tapered shape.

An embodiment of the present invention is a method for manufacturing the semiconductor device set forth above, wherein: a step of forming the oxide semiconductor layer includes the steps of: forming a first oxide semiconductor film on the gate insulating layer, wherein the first oxide semiconductor film has a first composition where an In atomic ratio with respect to all metal elements of the semiconductor layer is greater than a Zn atomic ratio thereof; forming a second oxide semiconductor film on the first oxide semiconductor film, wherein the second oxide semiconductor film has a second composition where an In atomic ratio with respect to all metal elements of the semiconductor layer is smaller than a Zn atomic ratio thereof; annealing the first oxide semiconductor film and the second oxide semiconductor film at a temperature of 400° C. or more and 480° C. or less; after the annealing step, forming an etching mask on the second oxide semiconductor film using a photoresist; and etching the first oxide semiconductor film and the second oxide semiconductor film using an etchant with an etching mask interposed therebetween, thereby obtaining the oxide semiconductor layer.

In one embodiment, 1<R2/R1≤1.23 is satisfied where R1 is an etching rate of the first oxide semiconductor film for the etchant, and R2 is an etching rate of the second oxide semiconductor film for the enchant.

In one embodiment the oxide semiconductor layer includes an In—Ga—Zn—O-based semiconductor.

In one embodiment, the oxide semiconductor layer includes a crystalline In—Ga—Zn—O-based semiconductor.

In one embodiment, the TFT is of a channel etch type.

Advantageous Effects of Invention

One embodiment of the present invention provides a semiconductor device including oxide semiconductor TFTs and a method for manufacturing the same, wherein the reliability can be improved.

BRIEF DESCRIPTION OF DRAWINGS

FIGS. 1(a) and 1(b) schematically show an active matrix substrate 100 according to an embodiment of the present invention, wherein FIG. 1(a) is a plan view, and FIG. 1(b) is a cross-sectional view taken along line 1B-1B' of FIG. 1(a).

FIGS. 2(a) and 2(b) schematically show an active matrix substrate 200 of a reference example, wherein FIG. 2(a) is a plan view, and FIG. 2(b) is a cross-sectional view taken along line 2B-22B' of FIG. 2(a).

FIGS. 5(a) and 5(b) are graphs showing the results of an experiment example of obtaining the etching rate for the first oxide semiconductor film and the second oxide semiconductor film, wherein FIG. 5(a) shows the results for a case where the annealing temperature was 320° C. or more and 400° C. or less (reference example), and FIG. 5(b) shows the results for a case where the annealing temperature was 400° C. or more and 480° C. or less (present invention).

DESCRIPTION OF EMBODIMENTS

Figure 1:
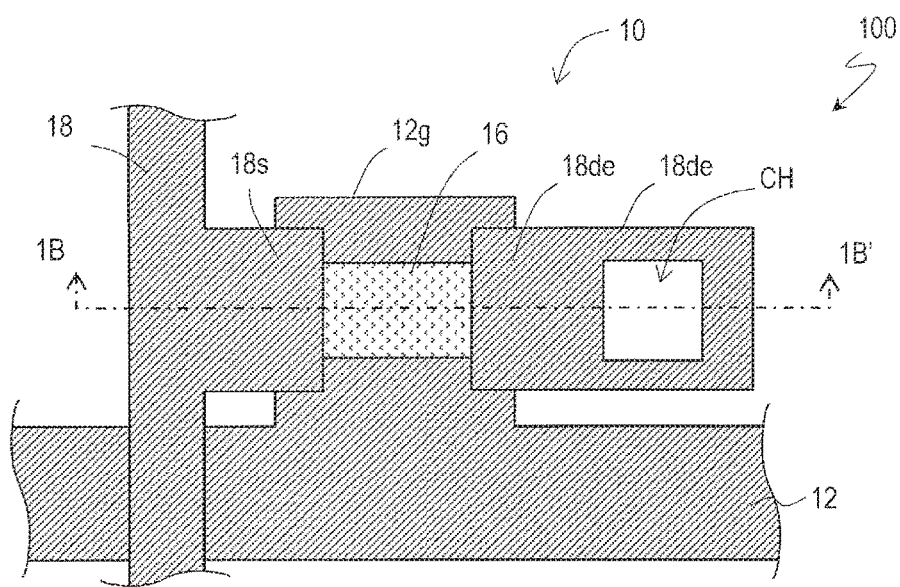
Figure 1:
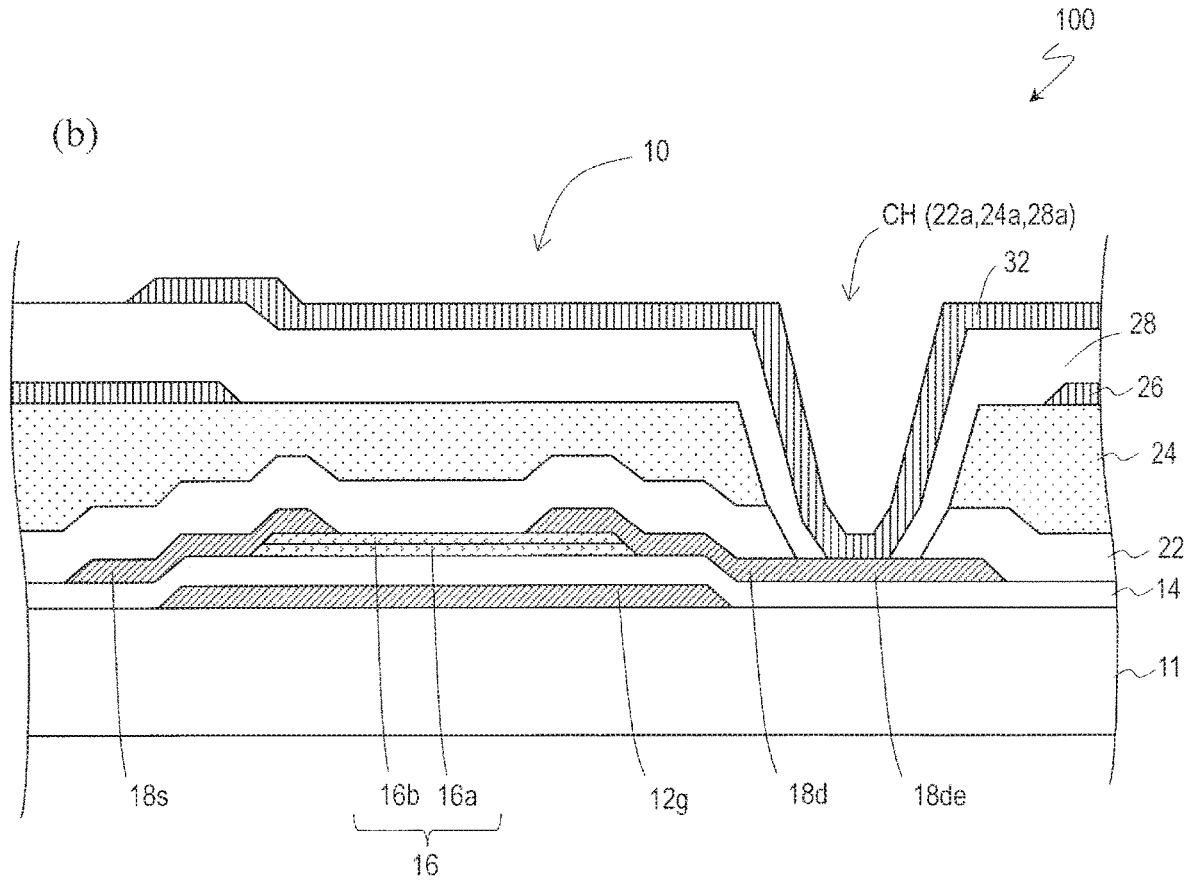

A semiconductor device and a method for manufacturing the same according to an embodiment of the present invention will now be described with reference to the drawings. An example where the embodiment of the present invention is applied to an active matrix substrate of a liquid crystal display panel will be described below, but the embodiment of the present invention is not limited to this. The embodiment of the present invention can be applied to semiconductor devices having oxide semiconductor TFTs formed on the substrate, such as other display panels (e.g., organic EL display panels) or flat panel detection devices (e.g., image pickup devices).

FIGS. 1(a) and 1(b) schematically show an active matrix substrate 100 according, to the embodiment of present invention. FIG. 1(a) is a schematic plan view of the active matrix substrate 100, and FIG. 1(b) is a schematic cross-sectional view of the active matrix substrate 100, taken along line 1B-1B' of FIG. 1(a). Note that FIG. 1(a) does not show the configuration of layers above the TFT 10.

The active matrix substrate 100 includes a glass substrate 11, and TFTs 10 supported on the glass substrate 11. The TFT 10 includes a gate electrode 12g, a gate insulating layer 14 that covers the gate electrode 12g, and an oxide semiconductor layer 16 formed on the gate insulating layer 14. A source electrode 18s a drain electrode 18d are arranged so as to be spaced apart from each other and opposing each other on the oxide semiconductor layer 16, and are each in contact with the upper surface of the oxide semiconductor layer 16. The gate electrode 12g is formed integrally with a gate bus line 12, and the source electrode 18s is formed integrally with a source bus line 18. The TFT 10 is a channel etch-type bottom gate-type TFT.

As shown in FIG. 1(b), the active matrix substrate 100 further includes a protection layer 22 covering the TFT 10 and an organic, insulating layer (flattening layer) 24 formed on the protection layer 22, and a common electrode 26, an inorganic insulating layer 28 and a pixel electrode 32 are formed over an organic insulating layer 24. The pixel electrode 32 is connected to an extension portion 18de of the drain electrode 18d through a contact hole CH, which is formed in the protection layer 22, the organic insulating layer 24 and the inorganic insulating layer 28. The active matrix substrate 100 can be used an a liquid crystal display panel of an FFS (Fringe Field Switching) mode, for example. Other structures of the active matrix substrate 100 and the structure and the operation of a liquid crystal display panel of an FSS mode will not be described below as they are well known in the art.

The oxide semiconductor layer 16 of the TFT 10 has a layered structure including a first oxide semiconductor layer 16a in contact with the gate insulating layer 14, and a second oxide semiconductor layer 16b layered on the first oxide semiconductor layer 16a. The first oxide semiconductor layer 16a and the second oxide semiconductor layer 16b both include In, Ga and Zn, and the In atomic ratio with respect to all metal elements of the first oxide semiconductor layer 16a is greater than the Zn atomic ratio thereof (In>Zn), and the In atomic ratio with respect to all metal elements of the second oxide semiconductor layer 16b smaller than the Zn atomic ratio thereof (In<Zn). As for the composition of the first oxide semiconductor layer 16a, for example, the atomic ratio In:Ga:Zn between In, Ga and Zn is about 5:about 1:about 4 (it may be 4 to 6:0.8 to 1.2:3.2 to 4.8, for example), and as for the composition of the second oxide semiconductor layer 16b, example, the atomic ratio In:Ga:Zn between In, Ga and Zn is about 1:about 3:about 6 (it may be 0.8 to 1.2:2.4 to 3.6:4.8 to 7.2, for example).

The thickness of the first oxide semiconductor layer 16a is 5 nm or more and 80 nm or less, for example, and the thickness of the second oxide semiconductor layer 16b is 5 nm or more and 80 nm or less, for example. The thickness of the entire oxide semiconductor layer 16 is 10 nm or more and 160 nm or less, for example.

The TFT 10 including the oxide semiconductor layer 16 having such a layered structure has advantages as follows.

With a channel etch-type oxide semiconductor TFT, the surface of the oxide semiconductor layer is likely to have etching damage during the source-drain separation step, and if the oxide semiconductor layer is of a single layer, the etching damage influences the entirety of the oxide semiconductor layer, thereby lowering the TFT characteristics. When a source metal layer including Cu is used, Cu may diffuse into the oxide semiconductor layer during the source-drain separation step, etc., and the threshold voltage of the TFT may fluctuate.

In contrast, the oxide semiconductor layer 16 of the TFT 10 of the active matrix substrate 100 of the present embodiment has a layered structure including the first oxide semiconductor layer 16a in contact with the gate insulating layer 14 and the second oxide semiconductor layer 16b layered on the first oxide semiconductor layer 16a, wherein the first oxide semiconductor layer 16a, which is closer to the gate electrode 12g, has the In atomic ratio with respect to all metal elements higher than the Zn atomic ratio (In>Zn), and has a high mobility. The source electrode 18s and the drain electrode 18d are in contact with the upper surface of the second oxide semiconductor layer 16b. The second oxide semiconductor layer 16b has the In atomic ratio with respect to ail metal elements smaller than the Zn atomic ratio (In<Zn), and has a good resistance against the diffusion of Cu of the source metal layer. Therefore, the damage from the source-drain separation step reaching the first oxide semiconductor layer 16a is suppressed, thereby suppressing the lowering of the TFT characteristics of the TFT 10 and the fluctuation of the threshold voltage of the TFT.

However, according to a study by the present inventors, when the oxide semiconductor layer 16 is formed under the same conditions as those for a single-layer oxide semiconductor layer (having the same composition as the first oxide semiconductor layer 16a), the side surface of the oxide semiconductor layer 16 may have a reverse tapered shape as will be described below with reference to FIG. 2. When the side surface of the oxide semiconductor layer 16 has a reverse tapered shape, the TFT may not be sufficiently covered by the protection layer, thereby lowering the reliability, for example. In contrast, the oxide semiconductor layer 16 of the TFT 10 of the active matrix substrate 100 of the present embodiment has a side surface of a forward tapered shape, and these problems do not occur.

The active matrix substrate 100 is manufactured as follows, for example.

(1) Formation of Gate Metal Layer (Gate Bus Line 12, Gate Electrode 12g, etc.)

A metal film (thickness: 50 nm or more and 500 nm or less, for example) is formed on the glass substrate 11 by sputtering method, for example, and then patterned. The metal film may be for example a Cu/Ti (upper/lower) layered film including a Ti film (thickness: 5 nm or more and 100 nm or less) and a Cu film (thickness: 100 nm or more and 500 nm or less) layered in this order. The patterning is performed by a photolithography process known in the art (photoresist application, exposure, development, etching, resist removal). Etching is performed by wet etching, for example.

(2) Formation of Gate Insulating Layer 14

An SiNx film (thickness: 200 nm or more and 500 nm or less) is formed by a CVD method so as to cover the gate metal layer, and an $SiO_2$ film (thickness: 25 nm or more and 100 nm or less) is formed thereon. By arranging the $SiO_2$ film on the side of the gate insulating layer 14 that is in contact with the oxide semiconductor layer 16, it is possible to effectively reduce the oxygen vacancies of the oxide semiconductor layer 16.

(3) Formation of Oxide Semiconductor Layer 16

A first oxide semiconductor film (thickness: 5 nm or more and 80 nm or less, for example) to be the first oxide semiconductor layer 16a and a second oxide semiconductor film (thickness: 5 nm or more and 80 nm or less, for example) to be the second oxide semiconductor layer 16b are successively deposited by a sputtering method on the gate insulating layer 14, for example, wherein the first oxide semiconductor film has a first composition where the In atomic ratio with respect to all metal elements is greater than the Zn atomic ratio, and the second oxide semiconductor film has a second composition where the In atomic ratio with respect to all metal elements is smaller than the Zn atomic ratio.

Then, before the patterning step, the first oxide semiconductor film and the second oxide semiconductor film are annealed at a temperature of 400° C. or more and 480° C. or less. With this annealing treatment, it is possible to obtain the oxide semiconductor layer 16 having the side surface of a forward tapered shape as shown in an experiment example later. While the anneal time is dependent on the composition, the thickness and the annealing temperature of the first oxide semiconductor film and the second oxide semiconductor film, it is about 30 min or more and 90 min or less. The first oxide semiconductor film and the second oxide semiconductor film are crystalline films.

Then, the first oxide semiconductor film and the second oxide semiconductor film are patterned. Patterning is performed by a photolithography process known in the art. The etching is performed by wet etching. The etchant may be a solution including phosphoric acid, acetic acid and nitric acid mixed together, an ammonia-hydrogen peroxide mixture. (31 wt % of hydrogen peroxide solution:28 wt % of ammonia water:water=5:2:2), or the like. Oxalic acid may be used.

(4) Formation of Opening of Gate Insulating Layer 14

An opening is formed at a predetermined position of a previously-formed $SiO_2$ film/SiNx film (upper/lower) for the gate insulating layer 14. The opening is to be a contact hole (not shown) between the source metal layer and the gate metal layer, for example. The formation of the opening is performed by a photolithography process known in the art. The etching may be performed by dry etching, for example. The etchant is $CF_4$, for example.

(5) Formation of Source Metal Layer (Source Bus Line 18, Source Electrode 18s, Drain Electrode 18d, etc.)

A metal film (thickness: 50 nm or more and 500 nm or less, for example) is formed by a sputtering method, for example, so as to cover the oxide semiconductor layer 16, and then patterned. The metal film may be for example a Cu/Ti (upper/lower) layered film including a Ti film (thickness: 5 nm or more and 100 nm or less) and a Cu film (thickness: 100 nm or more and 500 nm or less) layered in this order.

In the patterning, the upper Cu film is first wet-etched. For the etchant, an etchant containing hydrogen peroxide ($H_2O_2$) may be used, for example. Next, the Ti film of the lower layer is dry-etched. The etchant is $Cl_2$, for example.

In this step, a portion of the second oxide semiconductor layer 16b is exposed. However, even if oxygen vacancies, etc., occur in the second oxide semiconductor layer 16b, channel is formed in the first oxide semiconductor layer 16a under the second oxide semiconductor layer 16b, thereby suppressing the lowering of TFT characteristics.

(6) Formation of Protection Layer 22 and Organic Insulating Layer 24

Next, the protection layer 22 and the organic insulating layer (flattening layer) 24 covering the TFT 10 are formed. The protection layer 22 can be obtained or example by forming an $SiO_2$ film (thickness: 100 nm or more and 400 nm or less) by a CVD method, and forming an SiNx film (thickness: 20 nm or more and 200 nm or less) thereon. By forming an $SiO_2$ film so as to be in contact with the second oxide semiconductor layer 16b, it is possible to effectively reduce oxygen vacancies in the second oxide semiconductor layer 16b.

Next, an organic insulating film (thickness: 1 μm or more and 3 μm or less) is formed on the protection layer 22. An organic insulating film can be obtained for example by applying a photosensitive resin. For example, an opening (through hole) 24a is formed by exposing an organic insulating film that is formed from a photosensitive resin. Then, an opening 22a, through which a portion of the extension portion 18de of the drain electrode 18d is exposed, is formed at a predetermined position of the SiNx film/$SiO_2$ film (upper/lower) to be the protection layer 22.

(7) Formation of Common Electrode 26

Next, an ITO film (thickness: 50 nm or more and 200 nm or less) is formed on the organic insulating layer 24 by a sputtering method, for example, and patterned. The patterning is performed by a photolithography process known in the art. Etching is performed by wet etching, for example.

(8) Formation of Inorganic Insulating Layer 28

Next, an SiNx film (thickness: 100 nm or more and 400 nm or less) is formed so as to cover the common electrode 26 by a CVD method, for example, and patterned, thereby obtaining the inorganic insulating layer 28 having an opening 28a. Patterning is performed by a photolithography process known in the art. The etching may be performed by dry etching, for example. The etchant is $CF_4$, for example. The opening 22a of the protection layer 22, the opening 24a of the organic insulating layer 24 and the opening 28a of the inorganic insulating layer 28 together form a contact hole CH.

(9) Formation of pixel electrode 32

An ITO film (thickness: 50 nm or more and 200 nm or less) is formed so as to cover the inorganic insulating layer 28 by a sputtering method, for example, and patterned. The pixel electrode 32 is connected to the extension portion 18de of the drain electrode 18d through the contact hole CH. The pixel electrode 32 has a plurality of slits that are parallel to each other, for example, and the active matrix substrate 100 is used Hr a liquid crystal display panel of an FFS mode.

Figure 2:
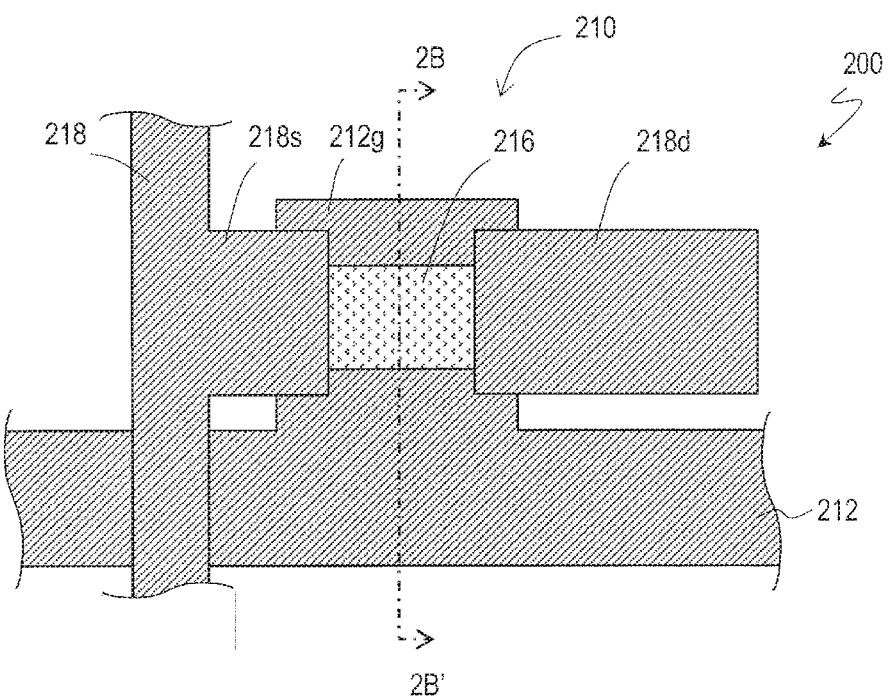
Figure 2:
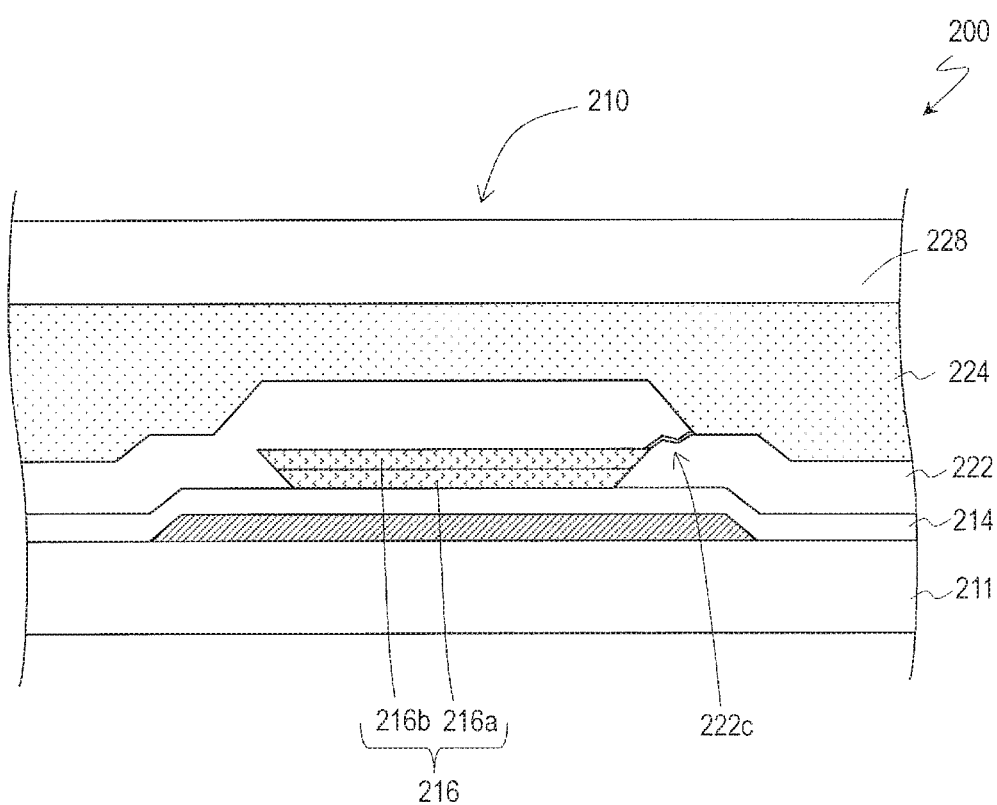

Next, FIGS. 2(a) and 2(b) schematically show an active matrix substrate 200 of a reference example. FIG. 2(a) is a schematic plan view of the active matrix substrate 200, and FIG. 2(b) is a schematic cross-sectional view of the active matrix substrate 200, taken along line 2B-2B' of FIG. 2(a). Note that FIG. 2 does not show the pixel electrode, and FIG. 2(a) does not show the configuration of layers above a TFT 210.

The active matrix substrate 200 can be manufactured by the manufacturing method as described above, except that the temperature of the annealing treatment after the deposition of the first oxide semiconductor film and the second oxide semiconductor film and before the patterning step is less than 400° C., in the step (3) of forming the oxide semiconductor layer 16 of the method for manufacturing the active matrix substrate 100 described above.

The active matrix substrate 200 includes a glass substrate 211, and TFTs 210 supported on the glass substrate 211. The TFT 210 includes a gate electrode 212g, a gate insulating layer 214 that covers the gate electrode 212g, and an oxide semiconductor layer 216 formed on the gate insulating layer 214. A source electrode 218s and a drain electrode 218d are arranged so as to be spaced apart from each other and opposing each other on the oxide semiconductor layer 216, and are each in contact with the upper surface of the oxide semiconductor layer 216. The gate electrode 212g is formed integrally with a gate bus line 212, and the source electrode 218s is formed integrally with a source bus line 218. The active matrix substrate 200 further includes a protection layer 222 covering the TFT 210 and an organic insulating layer (flattening layer) 224 formed on she protection layer 222, as shown in FIG. 2(b), and a common electrode (not shown), an inorganic insulating layer 228 and a pixel electrode (not shown) are formed the an organic insulating layer 224.

The oxide semiconductor layer 216 of the TFT 210 has a layered structure including a first oxide semiconductor layer 216a in contact with the gate insulating layer 214, and a second oxide semiconductor layer 216b layered on the first oxide semiconductor layer 216a. The first oxide semiconductor layer 216a and the second oxide semiconductor layer 216b both include In, Ga and Zn, and the In atomic ratio with respect to all metal elements of the first oxide semiconductor layer 216a is greater than the Zn atomic ratio thereof (In>Zn), and the In atomic ratio with respect to all metal elements of the second oxide semiconductor layer 216b is smaller than the Zn atomic ratio thereof (In<Zn).

As with the method for forming the oxide semiconductor layer 16 described above, a first oxide semiconductor film (thickness: 5 nm or more and 80 nm or less, for example) and a second oxide semiconductor film (thickness: 5 nm or more and 80 nm or less, for example) are successively deposited by a sputtering method, for example, wherein the first oxide semiconductor film has a first composition where the In atomic ratio is greater than the Zn atomic ratio, and the second oxide semiconductor film has a second composition where the In atomic ratio is smaller than the Zn atomic ratio. Then, the annealing treatment before the patterning step is performed at a temperature less than 400° C. (e.g., 330° C.). The annealing treatment time is 30 min or more and 90 min or less, for example. Then, as, with the method for forming the oxide semiconductor layer 16 described above, the first oxide semiconductor film and the second oxide semiconductor film are patterned. Then, the oxide semiconductor layer 216 having a reverse tapered side surface is formed as shown in FIG. 2(b). While FIG. 2(b) shows the cross-sectional shape of the oxide semiconductor layer 216 along the channel width direction, the cross-sectional shape along the channel length direction also has a reverse tapered side surface.

When the oxide semiconductor layer 216 has a reverse tapered shape, the protection layer (e.g., SiNx film/$SiO_2$ film) 222 formed on the oxide semiconductor layer 216 may fail to sufficiently cover the oxide semiconductor layer 216, thereby forming a crack 222c.

When the crack 222c is formed in the protection layer 222, moisture that has passed through the organic insulating layer 224 is not blocked by the protection layer 222, thereby reaching the oxide semiconductor layer 216 and fluctuating the TFT characteristics. Moreover, it may lead to corrosion of the source metal layer (the source electrode 218s, the drain electrode 218d and the source bus line 218).

According to a study by the present inventors, it is possible to obtain an oxide semiconductor layer whose side surface has a forward tapered shape by depositing the first oxide semiconductor film and the second oxide semiconductor film (which may be referred to as an "oxide semiconductor layered film"), and then annealing the oxide semiconductor layered film at a temperature of 400° C. or more and 480° C. or less before the patterning step.

Figure 3:
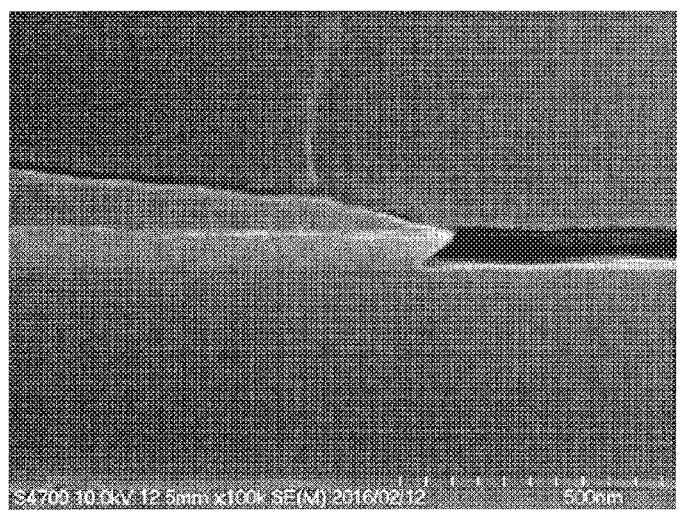
FIG. 3 shows sectional SEM image taken after patterning an oxide semiconductor layered film (reference example) for which the annealing temperature was 320° C. or more and 400° C. or less.
Figure 4:
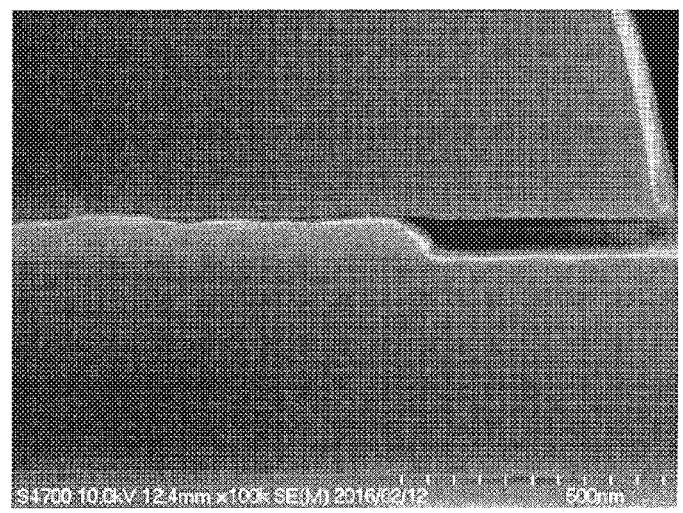
FIG. 4 shows a sectional SEM image taken after patterning an oxide semiconductor layered film (present invention) for which the annealing temperature was 400° C. or more and 480° C. or less.

FIG. 3 shows a cross-sectional SEM image of an oxide semiconductor layered film for which the annealing temperature was 320° C. or more and 400° C. or less (reference example) after being patterned. FIG. 4 shows a cross-sectional SEM image of an oxide semiconductor layered film for which the annealing temperature was 400° C. or more and 480° C. or less (present invention) after being patterned. In FIG. 3 and FIG. 4, the brightest (white) portion is the oxide semiconductor layered film. The boundary between the first oxide semiconductor film and the second oxide semiconductor film is not visible.

The oxide semiconductor layered film used herein was formed as follows.

First oxide semiconductor film: Composition (atomic ratio In:Ga:Zn) about 5:1:4, thickness 20 nm Second oxide semiconductor film: Composition (atomic ratio In:Ga:Zn) about 1:3:6, thickness 50 nm Annealing condition (430° C., 60 min)

The etching was performed by using a solution including phosphoric acid, acetic acid and nitric acid mixed together as the etchant, and immersing the structure in the etchant for 1.5 min at a temperature of 40° C.

As can be seen from FIG. 3, a reverse tapered side surface was formed by patterning an oxide semiconductor layered film for which the annealing temperature was 320° C. or more and 400° C. or less. That is, in some cases, the oxide semiconductor layer 216 having a reverse tapered side surface was formed, and the crack 222c was formed in the protection layer 222, thereby lowering the reliability, as described above with reference to FIG. 2

In contrast, as can be seen from FIG. 4, patterning an oxide semiconductor layered film for which the annealing temperature was 400° C. or more and 480° C. or less, a forward tapered side surface was formed. That is, the oxide semiconductor layer 16 having a forward tapered side surface is formed, and no crack is formed in the protection layer 22, as described above with reference to FIG. 1, thereby obtaining a TFT having a good reliability.

Figure 5:
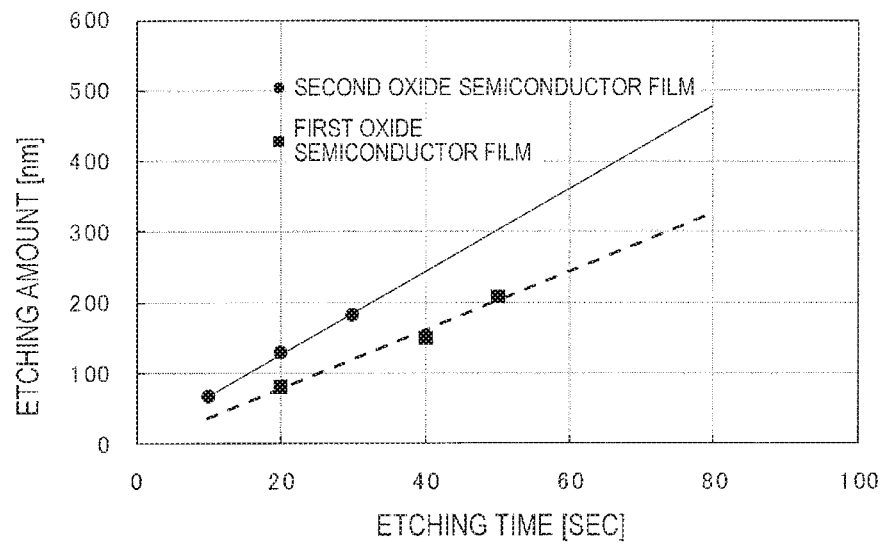
Figure 5:
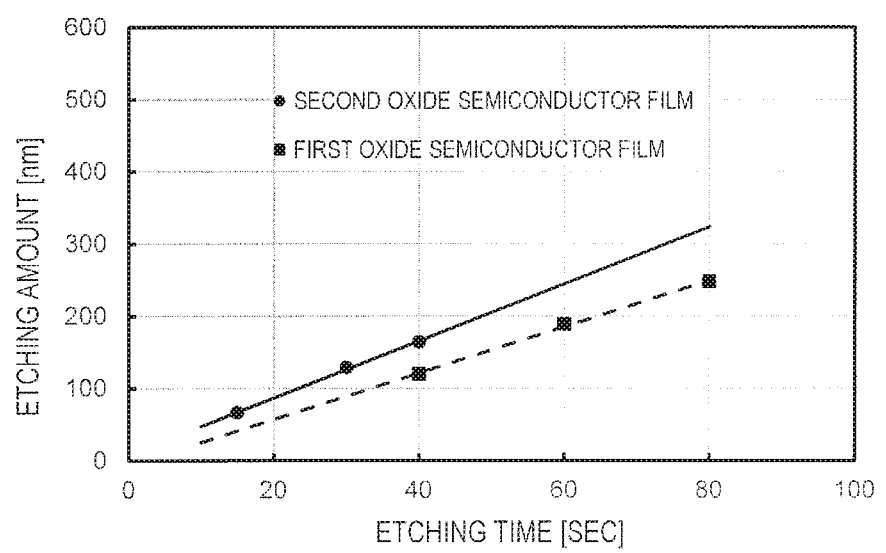

The results of studying the conditions under which a side surface of a forward tapered shape is formed when etching the oxide semiconductor layered film described above will be described with reference to FIGS. 5(a) and 5(b). FIGS. 5(a) and 5(b) are graphs showing the results of an experiment example of obtaining the etching rate of the first oxide semiconductor film and the second oxide semiconductor film, wherein FIG. 5(a) is for a case where the annealing temperature was 320° C. or more and 400° C. or less (reference example), and FIG. 5(b) is for a case where the annealing temperature was 400° C. or more and 480° C. or less resent invention). The compositions of the first oxide semiconductor film and the second oxide semiconductor film were as described above, and the thickness was set to 70 nm for both films. FIG. 5 shows the results of obtaining the relationship between the etching time and the etching amount (depth) by covering a portion of each oxide semiconductor film with a resist and using the same etchant as that described above. Table 1 below shows the etching rates obtained based on the inclinations of the straight lines in FIG. 5 (approximate lines obtained by a least squares method), and the ratio R2/R1 of the etching rate R2 of the second oxide semiconductor film relative to the etching rate R1 of the first oxide semiconductor film.

TABLE 1

| Annealing temperature | Oxide semiconductor film | Etching rate (nm/sec) | Etching rate ratio R2/R1 |
| --- | --- | --- | --- |
| Low temperature (Reference example) 330° C. | Second oxide semiconductor film | R2 = 5.86 | 1.41 |
| | First oxide semiconductor film | R1 = 4.14 | |
| High temperature (Present invention) 430° C. | Second oxide semiconductor film | R2 = 3.94 | 1.23 |
| | First oxide semiconductor film | R1 = 3.20 | |

As can be seen from the results of Table 1, a reverse tapered side surface is formed when the ratio R2/R1 of the etching rate R2 of the second oxide semiconductor film relative to the etching rate R1 of the first oxide semiconductor film is 1.41 or more, whereas a forward tapered side surface is formed when R2/R1 is 1.23 or less. It is believed that when the annealing temperature is 400° C. or more, the density difference between the first oxide semiconductor film and the second oxide semiconductor film becomes small, thereby resulting in a small R1/R2.

As shown in the experiment example described above, with an oxide semiconductor film containing In, Ga and Zn, an oxide semiconductor film having the In atomic ratio with respect to all metal elements smaller than the Zn atomic ratio has a higher etching rate than an oxide semiconductor film having the In atomic ratio with respect to all metal elements larger than the Zn atomic ratio (R2/R2>1), but the etching rate difference can be reduced by annealing at a temperature of 400° C. or more and 480° C. or less (e.g., 30 min or more and 90 min or less). As a result, an oxide semiconductor layered film is prevented from having a reverse tapered shape. It is believed that this phenomenon occurs with an etchant with which the etching rate is 3.0 nm/sec or more. Note that it is believed that the tapered shape of the side surface formed by the etching is also dependent on the adhesion between the oxide semiconductor film of the upper layer and the resist.

<Oxide Semiconductor>

The oxide semiconductor included in the oxide semiconductor layer 16 is preferably a crystalline oxide semiconductor having a crystalline portion. Examples of the crystalline oxide semiconductor include a polycrystalline oxide semiconductor and a microcrystalline oxide semiconductor.

The material, the structure, the film formation method of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

Note that crystalline structures of crystalline In—Ga—Zn—O-based semiconductors are disclosed in, for example, Japanese Laid Open Patent Publication No. 2014-007399, supra, Japanese Laid-Open Patent Publication No. 2012-134475, Japanese Laid-Open Patent Publication No. 2011-209727, etc. The disclosures of Japanese Laid-Open Patent Publication No. 2012-134475 and Japanese Laid-Open Patent Publication No. 2014-209727 are herein incorporated by reference in their entirety.

Another Embodiment

An oxide semiconductor TFT described above can preferably be used as a pixel TFT and/or a circuit TFT of a liquid crystal display panel, for example. Note that an oxide semiconductor TFT may be used as a pixel TFT and a crystalline silicon TFT (e.g., a polycrystalline silicon TFT) may be used as a circuit TFT.

A semiconductor device according Lo another embodiment of the present invention will now be described with reference to the drawings. The semiconductor device of the present embodiment is an active matrix substrate including oxide semiconductor TFTs and crystalline silicon TFTs formed on the same substrate.

The active matrix substrate includes a TPT (pixel TFT) for each pixel. The pixel TFT may be an oxide semiconductor TFT that uses an In—Ga—Zn—O-based semiconductor film as the active layer, for example.

A part or whole of the peripheral driving circuit may be formed integrally on the same substrate as the pixel TFTs. Such an active matrix substrate is referred to as a driver-monolithic active matrix substrate. With a driver-monolithic active matrix substrate, the peripheral driving circuit is provided in the region (the non-display region or the bezel region) other than the region (display region) including the plurality of pixels. TFTs (circuit TFTs) of the peripheral driving circuit are crystalline silicon TFTs that use a polycrystalline silicon film as the active layer. When oxide semiconductor TFTs are used as pixel TFTs and crystalline silicon TFTs as circuit TFTs, as described above, it is possible to reduce the power consumption in the display region and further to realize a smaller bezel region.

The TFT 10 described above with reference to FIG. 1 can be used as the pixel TFT. This will be discussed later.

Next, a more detailed configuration of the active matrix substrate of the present embodiment will be described with reference to the drawings.

Figure 6:
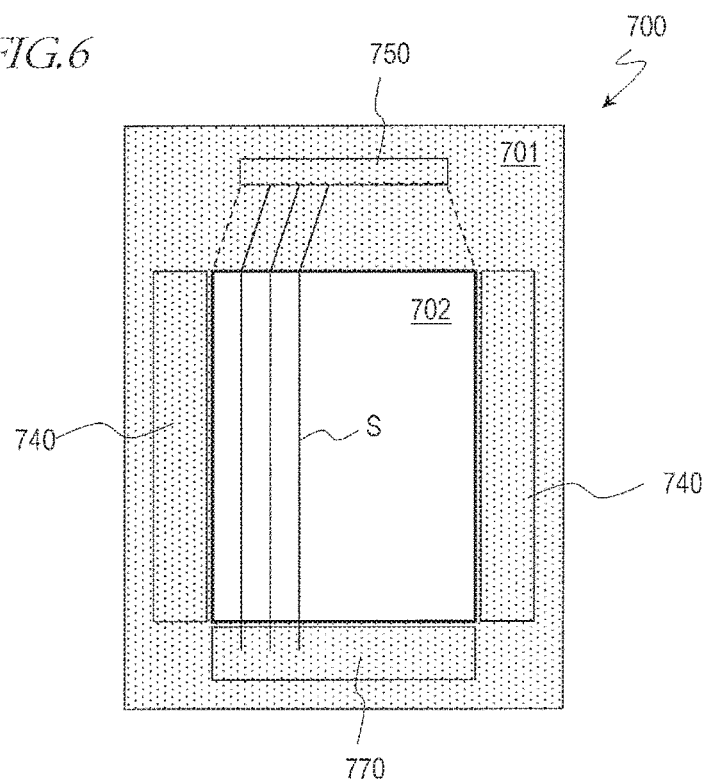
FIG. 6 is a schematic plan view showing an example of a planar structure of an active matrix substrate 700 according to another embodiment of the present invention.
Figure 7:
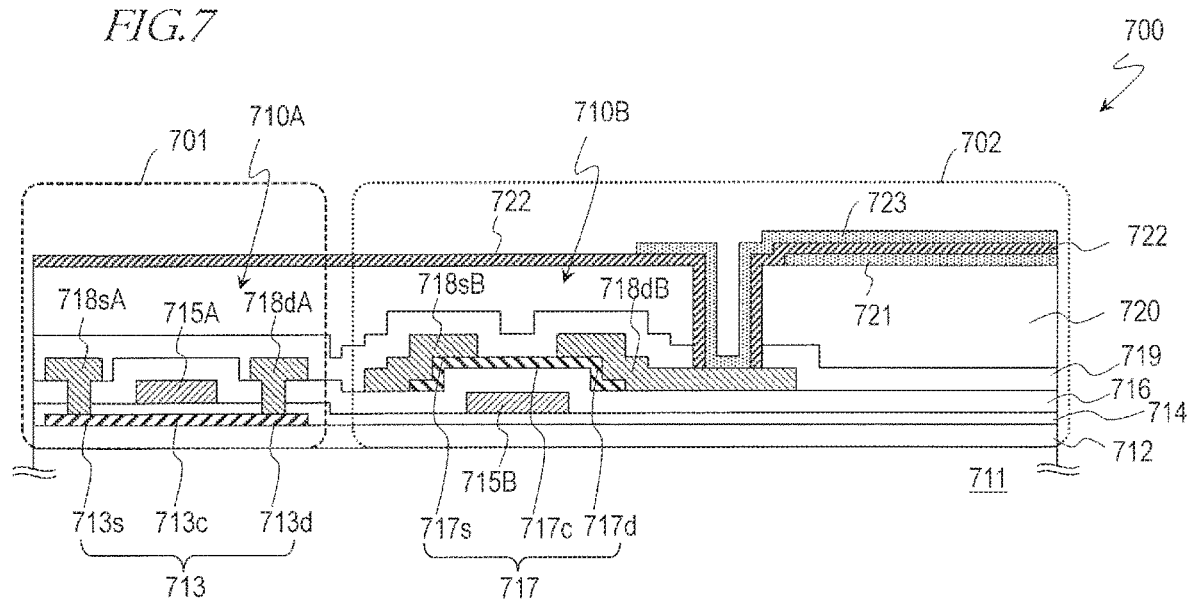
FIG. 7 is a cross-sectional view showing a crystalline silicon TFT 710A and an oxide semiconductor 710B of the active matrix substrate 700.

FIG. 6 is a schematic plan view showing an example of a planar structure of an active matrix substrate 700 of the present embodiment, and FIG. 7 is a cross-sectional view showing a cross-sectional structure of a crystalline silicon TFT (hereinafter, referred to as a "first thin film transistor") 710A and an oxide semiconductor TFT (hereinafter referred to as a "second thin film transistor") 710B of the active matrix substrate 700.

As shown in FIG. 6, the active matrix substrate 700 includes a display region 702 including a plurality of pixels and a region (non-display region) other than the display region 702. The non-display region includes a driving circuit formation region 701 where driving circuits are provided. The driving circuit formation region 701 includes a gate driver circuit 740, a test circuit 770, etc. The display region 702 includes a plurality of gate bus lines (not shown) extending in the row direction, and a plurality of source bus lines S extending in the column direction. Although not shown in the figures, each pixel is defined by a gate bus line and a source bus line S, for example. The gate bus lines are connected to the respective terminals of the gate driver circuit. The source bus lines S are connected to the respective terminals of a driver IC 750 mounted on the active matrix substrate 700.

As shown in FIG. 7, on the active matrix substrate 700, a second thin film transistor 710B is formed as a pixel TFT for each pixel in the display region 702, and a first thin film transistor 710A is formed as a circuit TFT in the driving circuit formation region 701.

The active matrix substrate 700 includes a substrate 711, a base film 712 formed on the surface of the substrate 711, the first thin film transistor 710A formed on the base film 712, and the second thin film transistor 710B formed on the base film 712. The first thin film transistor 710A is a crystalline silicon TFT whose active region primarily contains a crystalline silicon. The second thin film transistor 710B is an oxide semiconductor TFT whose active region primarily contains an oxide semiconductor. The first thin film transistor 710A and the second thin film transistor 710B are integrally built on the substrate 711. The "active region" as used herein refers to a portion of a semiconductor layer to be t e active layer of a TFT where the channel is formed.

The first thin film transistor 710A includes a crystalline silicon semiconductor layer (e.g., a low-temperature polysilicon layer) 713 formed on the base film 712, a first insulating layer 714 that covers a crystalline silicon semiconductor layer 713, and a gate electrode 715A provided on the first insulating layer 714. A portion of the first insulating layer 714 that is located between the crystalline silicon semiconductor layer 713 and the gate electrode 715A functions as the gate insulating film of the first thin film transistor 710A. The crystalline silicon semiconductor layer 713 includes a region where the channel is formed (the active region) 713c, and a source region 713s and a drain region 713d that are located on opposite racier of the active region. In this example, a portion of the crystalline silicon semiconductor layer 713 that overlaps with the gate electrode 715A with the first insulating layer 714 interposed therebetween serves as the active region 713c. The first thin film transistor 710A includes a source electrode 718sA and a drain electrode 718dA that are connected to the source region 713s and the drain region 713d, respectively. The source and drain electrodes 718sA and 718dA may be provided on an inter-layer insulating film (herein, a second insulating layer 716) that covers the gate electrode 715A and the crystalline silicon semiconductor layer 713, and connected to the crystalline silicon semiconductor layer 713 through contact holes formed in the inter-layer insulating film.

The second thin film transistor 710B includes a gate electrode 715B provided on the base film 712, the second insulating layer 716 that covers the gate electrode 715B, and an oxide semiconductor layer 717 arranged on the second insulating layer 716. As shown in the figure, the first insulating layer 714, which is the gate insulating film of the first thin film transistor 710A, may be extended to a region where the second thin film transistor 710B is formed. In such a case, the oxide semiconductor layer 717 may be formed on the first insulating layer 714. A portion of the second insulating layer 716 that is located between the gate electrode 715B and the oxide semiconductor layer 717 functions as the gate insulating film of the second thin film transistor 710B. The oxide semiconductor layer 717 includes a region (active region) 717c that is formed in the channel, and a source contact region 717s and a drain contact region 717d that are located on opposite sides of the active region. In this example, a portion of the oxide semiconductor layer 717 that overlaps with the gate electrode 715B with the second insulating layer 716 interposed therebetween serves as the active region 717c. The second thin film transistor 710B further includes a source electrode 718sB and a drain electrode 718dB that are connected to the source contact region 717s and the drain contact region 717d, respectively. Note that the base film 712 may be absent on the substrate 711.

The thin film transistors 710A and 710B are covered by a passivation film 719 and a flattening film 720. In the second thin film transistor 710B, which functions as a pixel TFT, the gate electrode 715B is connected to a gate bus line (not shown), the source electrode 718sB is connected to a source bus line (not shown), and the drain electrode 718dB is connected to a pixel electrode 723. In this example, the drain electrode 718dB is connected to the corresponding pixel electrode 723 through the opening formed in the passivation film 719 and the flattening film 720. A video signal is supplied to the source electrode 718sB via the source bus line, and a necessary charge is written to the pixel electrode 723 based on the gate signal from the gate bus line.

Note that as shown in the figure, a transparent conductive layer 721 may be formed as the common electrode on the flattening film 720, and a third insulating layer 722 may be formed between the transparent conductive layer (common electrode) 721 and the pixel electrode 723. In such a case, a slit-shaped opening may be provided in the pixel electrode 723. The active matrix substrate 700 can be applicable to a display device of an FFS (Fringe Field Switching) mode, for example. The FFS mode is a transverse electric field mode in which a pair of electrodes are provided on one substrate, and an electric field is applied through the liquid crystal molecules in the direction (transverse direction) parallel to the substrate surface. In this example, there is produced an electric field represented by lines of electric force that emerge from the pixel electrode 723, pass through the liquid crystal layer (not shown), and extend to the common electrode 721 through the slit-shaped opening of the pixel electrode 723. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

The TFT 10 described above with reference to FIG. 1 can be used as the second thin film transistor 710B of the present embodiment. When the TFT 10 of FIG. 1 is used, the gate electrode 12g, the gate insulating layer 14, the oxide semiconductor layer 16 and source and drain electrodes 18s and 18d of the TFT 10 may be associated respectively with the gate electrode 715B, the second insulating layer (gate insulating layer) 716, the oxide semiconductor layer 717 and the source and drain electrodes 718sB and 718dB shown in FIG. 7.

The thin film transistor 710B, which is an oxide semiconductor TFT, may be used as the TFT of the test circuit 770 shown in FIG. 6 (test TFT).

Note that although not shown in the figures, the test TFTs and the test circuit may be formed in the region where the driver IC 750 is mounted as shown in FIG. 6, for example. In such a case, the test TFT may be arranged between the driver IC 750 and the substrate 711.

In the illustrated example, the first thin film transistor 710A has a top gate structure including the crystalline silicon semiconductor layer 713 arranged between the gate electrode 715A and the substrate 711 (the base film 712). On the other hand, the second thin film transistor 710B has a bottom gate structure including the gate electrode 715B arranged between the oxide semiconductor layer 717 and the substrate 711 (the base film 712). By employing such a structure, when forming two different thin film transistors 710A and 710B integrally on the same substrate 711, it is possible to more effectively suppress the increase of the number of manufacturing steps and the manufacturing cost.

The TFT structures of the first thin film transistor 710A and the second thin film transistor 710B are not limited to those described above. For example, these thin film transistors 710A and 710B may have the same TFT structure. Alternatively, the first thin film transistor 710A may have a bottom gate structure, and the second thin film transistor 710B may have a top gate structure. In the case of a bottom gate structure, it may be of a channel etch type, as is the thin film transistor 710B, or may be of an etch stop type. It may be of a bottom contact type where the source electrode and the drain electrode are located under the semiconductor layer.

The second insulating layer 716, which is the gate insulating film of the second thin film transistor 710B, may be extended to a region where the first thin film transistor 710A is formed, and may function as an inter-layer insulating film that covers the gate electrode 715A and the crystalline silicon semiconductor layer 713 of the first thin film transistor 710A. Where the inter-layer insulating film of the first thin film transistor 710A and the gate insulating film of the second thin film transistor 710B are formed in the same layer (second insulating layer) 716 as described above, the second insulating layer 716 may have a layered structure. For example, the second insulating layer 716 has a layered structure including a hydrogen-donating layer that can supply hydrogen (e.g., a silicon nitride layer), and an oxygen-donating layer that can supply oxygen (e.g., a silicon oxide layer) arranged on the hydrogen-donating layer.

The gate electrode 715A of the firer thin film transistor 710A and the gate electrode 715B of the second thin film transistor 710B may be formed in the same layer. The source and drain electrodes 718sA and 718dA of the first thin film transistor 710A and the source and drain electrodes 718s3 and 718dB of the second thin film transistor 710B may be formed in the same layer. The phrase "formed in the same layer" refers to being formed using the same film (conductive film). Thus, it is possible to suppress the increase of the number of manufacturing steps and the manufacturing cost.

While a channel etch-type oxide semiconductor TFT has been illustrated above, the present invent on may be applied also to an etch stop-type oxide semiconductor TFT.

<Channel Etch>

With "channel etch-type TFTs", the etch stop layer is not formed over the channel region, as shown in FIG. 1(*b*), for example, and the lower surfaces of the channel-side end portions of the source electrode and the drain electrode are arranged so as to be in contact with the upper surface of the oxide semiconductor layer. Channel etch-type TFTs are formed for example by forming a source-drain electrode conductive film on an oxide semiconductor layer, and performing a source-drain separation. In the source-drain separation step, a surface portion of the channel region is etched in some cases.

<Etch Stop>

On the other hand, with a TFT (etch stop-type TFT) where the etch stop layer is formed over the channel region, the lower surfaces of the channel-side end portions of the source electrode and the drain electrode are located on the etch stop layer, for example. An etch stop-type TFT is formed for example by forming an etch stop layer that covers a portion of the oxide semiconductor layer to be the channel region, then forming a source-drain electrode conductive film on the oxide semiconductor layer and the etch stop layer, and performing a source-drain separation.

INDUSTRIAL APPLICABILITY

The embodiment of the present invention can desirably be used as a semiconductor device including oxide semiconductor TFTs (e.g., a liquid crystal display panel, an organic EL display panel, an active matrix substrate for use in these display panels), and a method for manufacturing the same.

REFERENCE SIGNS LIST

11: Glass substrate
12: Gate bus line
12*g*: Gate electrode
14: Gate insulating layer
16: Oxide semiconductor layer
16*a*: First oxide semiconductor layer
16*b*: Second oxide semiconductor layer
18: Source bus line
18*d*: Drain electrode
18*de*: Extension portion
18*s*: Source electrode
22: Protection layer
22*a*: Opening
24: Organic insulating layer
24*a*: Opening
26: Common electrode
28: inorganic insulating layer
28*a*: Opening
32: Pixel electrode
100: Active matrix substrate

The invention claimed is:

1. A method for manufacturing a semiconductor device, the semiconductor device comprising:

a substrate and a TFT supported on the substrate, wherein:

the TFT includes a gate electrode, a gate insulating layer that covers the gate electrode, and an oxide semiconductor layer that is formed on the gate insulating layer;

the oxide semiconductor layer has a layered structure including a first oxide semiconductor layer in contact with the gate insulating layer and a second oxide semiconductor layer layered on the first oxide semiconductor layer, wherein the first oxide semiconductor layer and the second oxide semiconductor layer both include In, Ga and Zn; and the oxide semiconductor layer has a side surface of a forward tapered shape, the method comprising:

a step of forming the oxide semiconductor layer comprises the steps of:

forming a first oxide semiconductor film on the gate insulating layer, wherein the first oxide semiconductor film has a first composition where an In atomic ratio is greater than a Zn atomic ratio;

forming a second oxide semiconductor film on the first oxide semiconductor film, wherein the second oxide semiconductor film has a second composition where an In atomic ratio is smaller than a Zn atomic ratio;

annealing the first oxide semiconductor film and the second oxide semiconductor film at a temperature of 400° C. or more and 480° C. or less;

after the annealing step, forming an etching mask on the second oxide semiconductor film using a photoresist; and etching the first oxide semiconductor film and the second oxide semiconductor film using an etchant with an etching mask interposed therebetween, thereby obtaining the first oxide semiconductor layer from the first oxide semiconductor film and obtaining the second oxide semiconductor layer from the second oxide semiconductor film, wherein an etching rate R2a of the second oxide semiconductor film for the etchant before the annealing step is larger than an etching rate R1a of the first oxide semiconductor film for the etchant before the annealing step, the annealing step is a step of reducing an etching rate difference between the first oxide semiconductor film and the second oxide semiconductor film, and $1 < R2/R1 \leq 1.23$ is satisfied where R1 is an etching rate of the first oxide semiconductor film for the etchant after the annealing step, and R2 is an etching rate of the second oxide semiconductor film for the etchant after the annealing step.

2. The manufacturing method according to claim 1, wherein the oxide semiconductor layer includes an In—Ga—Zn—O-based semiconductor.

3. The manufacturing method according to claim 1, wherein the oxide semiconductor layer includes a crystalline In—Ga—Zn—O-based semiconductor.

4. The manufacturing method according to claim 1, wherein the TFT is of a channel etch type.

5. The manufacturing method according to claim 1, wherein, as the etchant, either a solution including phosphoric acid, acetic acid, and nitric acid mixed together;

an ammonia-hydrogen peroxide mixture; or oxalic acid is used.

6. The manufacturing method according to claim 5, wherein, as the etchant, the solution including phosphoric acid, acetic acid and nitric acid mixed together is used.

7. The manufacturing method according to claim 1, wherein each of the etching rate R1 and the etching rate R2 is 3.0 nm/sec or more.

* * * * *